United States Patent [19]

Dupoy

[11] Patent Number: 5,058,146
[45] Date of Patent: Oct. 15, 1991

[54] DIGITAL COMPARATOR, DIGITAL RATIOMETER AND AMPLITUDE ANALYZER INCORPORATING SUCH RATIOMETERS

[75] Inventor: Marc Dupoy, Paris, France

[73] Assignee: Commissariat A L'Energie Atomique, Paris, France

[21] Appl. No.: 301,323

[22] Filed: Jan. 24, 1989

[30] Foreign Application Priority Data

Feb. 2, 1988 [FR] France ................... 88 01192

[51] Int. Cl.⁵ ............... H03K 21/38; G11C 15/00
[52] U.S. Cl. .................. 377/39; 324/77 B; 324/140 D; 377/54; 377/69; 377/49
[58] Field of Search ............ 377/39, 49, 54, 69; 328/161; 324/77 B

[56] References Cited

U.S. PATENT DOCUMENTS

| | | | |
|---|---|---|---|
| 3,981,586 | 9/1976 | Scott | 328/161 |
| 4,001,699 | 1/1977 | Denny et al. | 377/39 |
| 4,596,027 | 6/1986 | Bernardson | 377/39 |
| 4,704,723 | 11/1987 | Markland | 377/39 |
| 4,780,895 | 10/1988 | Paul | 377/39 |

FOREIGN PATENT DOCUMENTS 0061366 9/1982 European Pat. Off. .
0208602 1/1987 European Pat. Off. .

*Primary Examiner*—John S. Heyman

[57] ABSTRACT

Digital ratiometer and amplitude analyzer using such a ratiometer.

It is possible to solve the problems of the calculation and display of the ratio of two or more quantities, provided that the latter are converted into frequencies. Counting registers are used for evaluating these quantities. The filling of these counting registers (6,13) is prevented by bringing about a shift to the right (10,19) of all the registers as soon as (15) one of them is filled.

11 Claims, 3 Drawing Sheets

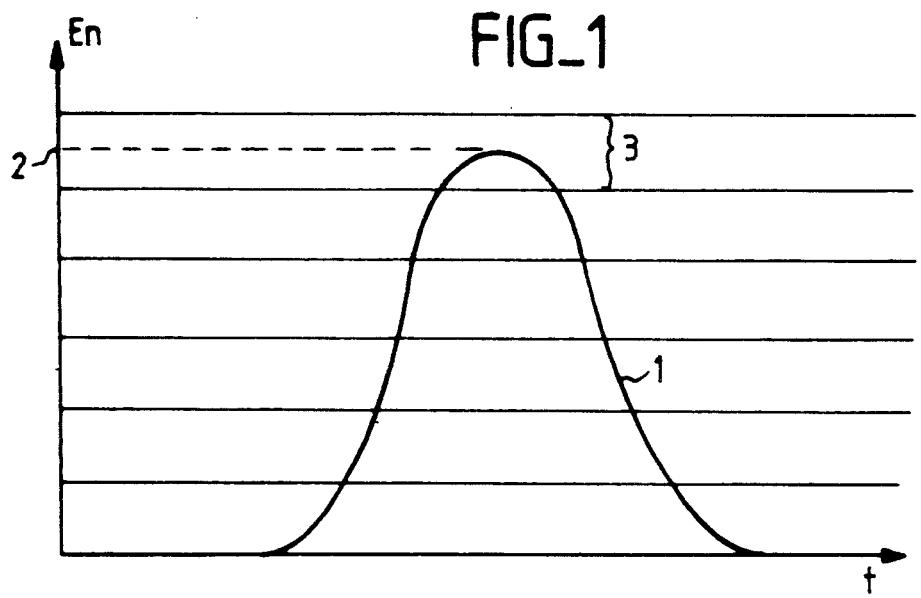
FIG_1
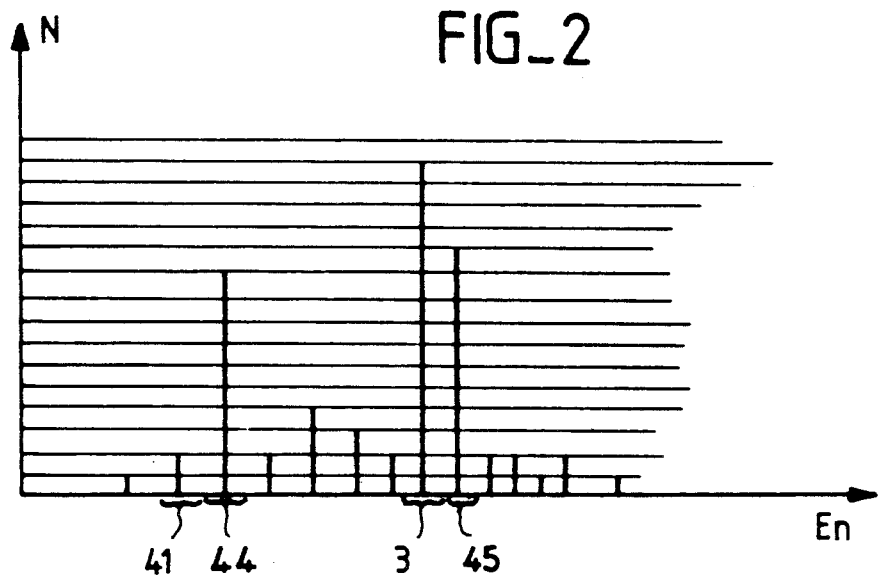
FIG_2
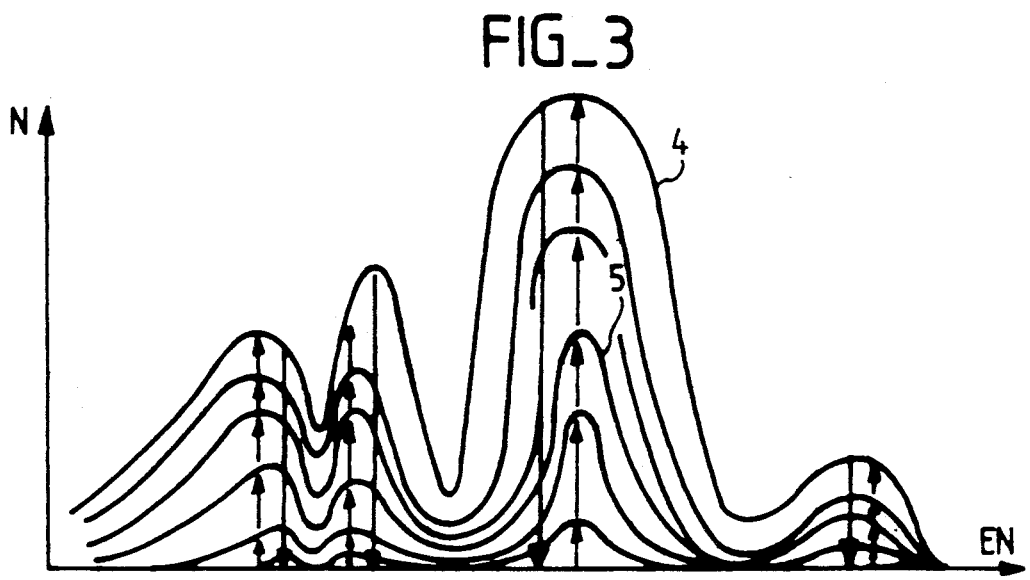
FIG_3

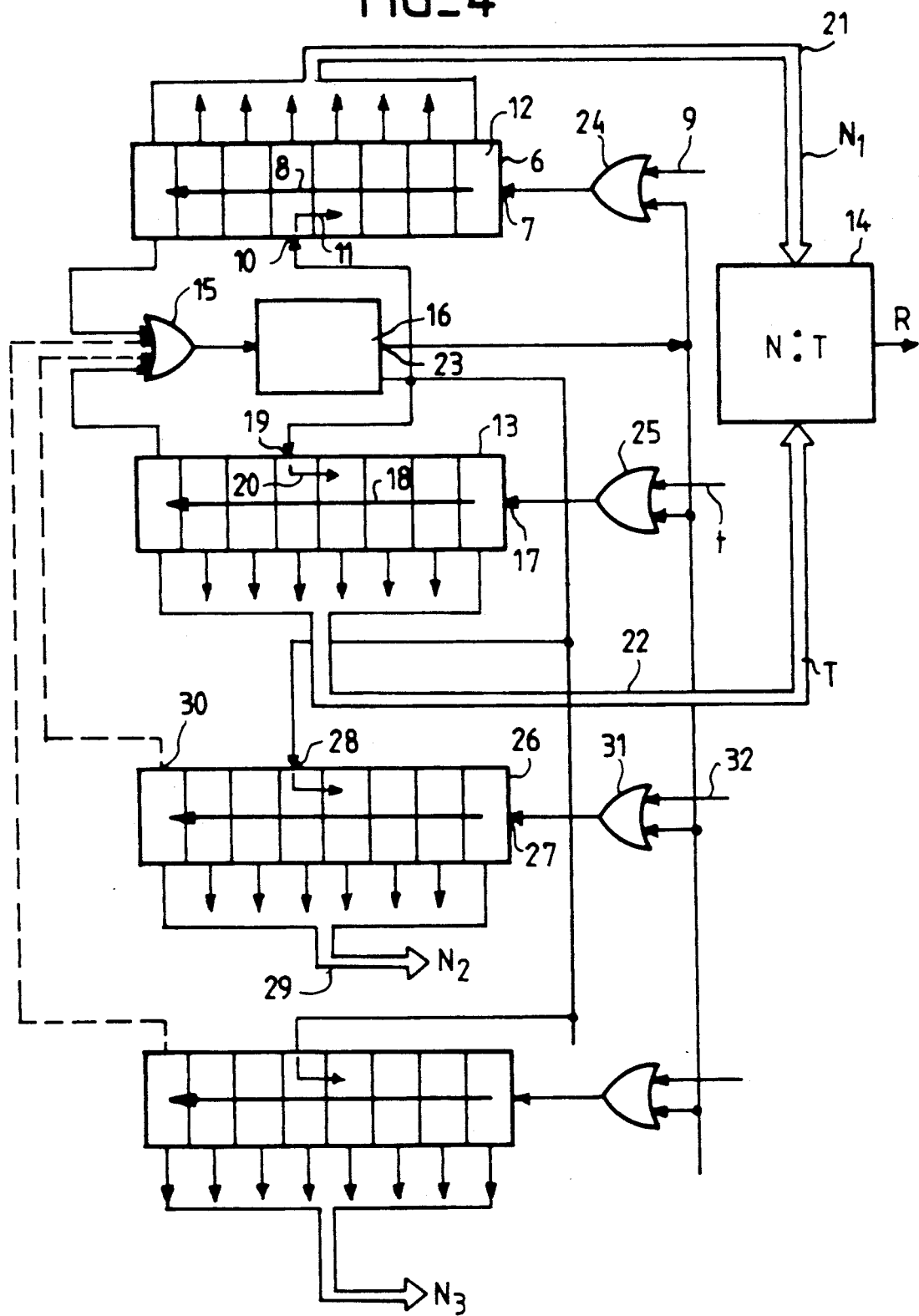
FIG_4

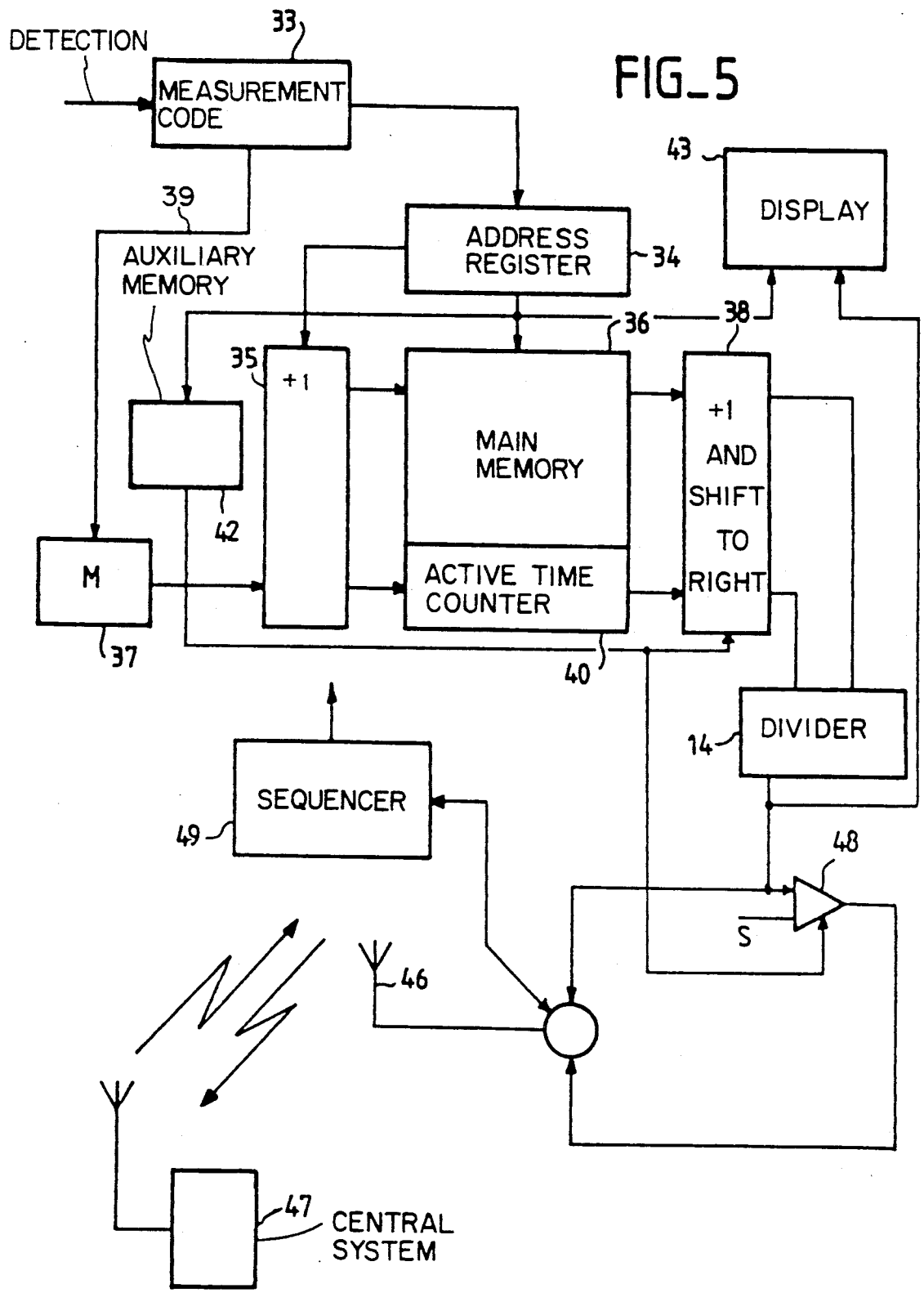

DIGITAL COMPARATOR, DIGITAL RATIOMETER AND AMPLITUDE ANALYZER INCORPORATING SUCH RATIOMETERS

DESCRIPTION

The present invention relates to a numerical or digital ratiometer, as well as to an amplitude analyser using such ratiometers. A ratiometer is a device giving a signal corresponding to the ratio of two evolutionary quantities. In the case of the present invention, these quantities are the frequencies of periodic or random pulse trains.

The invention is more particularly used in the field of measuring and monitoring radioactive missions, where the ratio relates to the frequency (division by time) of the production of radioactive events. In the nuclear field, such an apparatus operating in a single energy range is known as a counting rate meter. In a multichannel amplitude analyser, these radioactive events are firstly discriminated in an amplitude coder or encoder to establish the energy band to which they belong. They are then counted in each band as they appear. The relative distribution of the events in the different energy bands represents the signature, e.g. the radioactive spectrum of a particular emission, whose nature is studied. The number of registered events in each band, the band in which said number is at a maximum and the time evolution of said band provide quantitative and qualitative information on the analyzed radioactive substance.

The invention relates to an improvement to devices supplying these results in the radioactive field, but can still be applied to other fields. In particular, the ratiometer can be applied to the calculation of the ratio of two time-evolving, random quantities.

The counting of nuclear events taking place in a given energy range requires a prior resetting or zeroing of a counter, the starting up of said counter and the stopping of said counter at the end of a given time. These operations are time-consuming and can also lead to accuracy shortcomings in he thus performed measurements. Thus, the fact of having to fix the result of the measurement at the end of a given period means that said result can only be known to within a given statistical fluctuation. The effect of the latter between the individual measurements can lead to a significant reduction in the accuracy of the results. Finally, the results are only periodically known at the end of a preselected counting time.

For purpose of solving this problem, French Patent Application 85 10173 filed on July 3rd 1985 provides a "Process for using a binary register with n bistable cells making it possible to determine the ratio of two frequencies and an apparatus for performing the process". In this patent application which relates to the same field, the counter which counts the events in a given energy range is of a very particular type. To simplify the explanation, it is a binary register-counter advancing from right to left in accordance with a $\log_2$ law with a so-called counting input and having means for carrying out a division consisting of a shift to the right. The ideas of a shift to the right or left are justified in the sense that the least significant values of a result are conventionally placed in the western world to the right of the number representing said result, whereas the most significant values are placed to the left. The incrementation of such a register connected up as a counter consequently takes place from the right and each location or cell of the register is related to the right and left with shifted weight cells. In the most general case, the registers are of a binary type and each register can have a state 0 or a state 1. The modification of the content of a cell, when it passes from a state 1 to a state 0 i.e. every other time, leads to the incrementation of the content of the cell immediately to the left of aid cell. The shifting of the content of the cells of said register towards the right corresponds to the division in the binary mode and when the shift to the right represents one cell the division is a division by two.

It has been possible to demonstrate in this operating mode with a signal A incrementing the counter and a signal B periodically causing a shift to the right, that the counter content stabilizes at a value N characteristic of A/B. This ratio is between 1 and $2^{n-1}$, n being equal to the number of cells in the counter. It is also possible to demonstrate that this type of measurement making it unnecessary to fix the result at the end of a particular measurement period, makes it possible to minimize the effects of statistical fluctuations.

Nevertheless, the thus designed ratiometer, supplies a signal which oscillates with time. Thus, even in the hypothesis of a stability of the two input signals, the counting register gives a measurement evolving between N/2 and N during the measuring period. Immediately prior to the operation of shifting to the right the register content, the register contains the information N and immediately after it contains the information N/2. If it is wished to avoid this fluctuation, the result contained in the register before or after the shift to the right must be stored in a buffer register until the next shift to the right and constitutes the presented result.

Such an apparatus has a measuring dynamics essentially linked with the number of locations or cells in the shift register used, the measurement range being linked with the frequency of the shifts to the right. For the realisation of a counting rate meter with a shift controlled by a clock, it is apparent that for high radioactivities, where the number of events per second is high, it is necessary to use a fast clock otherwise there will be a prohibitive response time. However, with a low radioactivity, if the clock is too fast, the register content will always be zero because it is too frequently shifted to the right, i.e. it is definitively reset.

The use of a clock with an adjustable frequency so that, in a particular measuring range, an apparatus is obtained with a sufficiently high dynamics provides a solution, but the latter is very complex.

Moreover, in the case where the period between the shifts to the right of the register is long, the variation of the analysed signal is ignored during this period. If, for example, the duration of said period is a few minutes, the shift register regularly incrementing during said period will only reveal its state, which may be abnormally high, at the end of said period.

Thus, in summarizing, the hitherto known digital apparatuses, multichannel analysers or counting rate meters (monochannel) only supply the digital information at given instance, whose time spacing can be great and which is incompatible with the natures of the quantities which are to be monitored.

The present invention aims at obviating these disadvantages by providing an improved digital ratiometer, as well as a multichannel analyser provided with such ratiometers, whose use is simple, whose output signal is stable during the measurement acquisition time and whose measurement dynamics are auto-adaptable to the activities encountered whilst restoring a standardized signal, i.e. the activities are directly presented in the chosen unit, e.g. Becquerels, the channels no longer merely being counters and instead being constituted by digital counting rate meters.

Apart from its normal use an analyser according to the invention, integrated into a measuring or control system, can be used in the slave mode, i.e. it communicates its results when these are requested from it, no matter what the time and frequency of these requests. It can also operate in the master mode, i.e. it can spontaneously and immediately notify the fact that the measurement has exceeded the predetermined threshold on at least one of its channels.

The principle of the invention is diagrammatically based on the use of a second register, which is identical to the first, with a progression to the left for counting and a shift to the right for division. It has the possibility of simultaneously operating as a counter and a shift register to the right. The shifting to the right of the content of the two registers is dependent on the saturation or filling of a random register. Whichever of the two registers, which, becoming filled first, brings about the shift is called the leading register. The other register is the lead register. The two registers being incremented by frequencies $F_A$ and $F_B$ and simultaneously shifted, the ratio of their contents $N_A/N_B$ is consequently substantially constant to the extent that $F_A$ and $F_B$ are constant. This ratio can evolve from $F_A F_B = n_A/2$ to $F_B/F_A = n_B/2$, the values $n_A$ and $n_B$ representing the capacity of the registers A and B. Everything takes place as if the ratio of the two frequencies could be higher or lower than 1, whereas in the aforementioned patent application, the counting frequency could not be below the shift frequency. It is pointed out that it is not necessary for the capacity of the two registers, generally expressed as a power of 2, to be identical.

Such an arrangement can be directly used, e.g. for producing an apparatus permitting the comparison or slaving of two quantities, provided that said quantities can be converted into two frequencies proportional thereto.

Another possibility of the invention is, in the nuclear field, the construction of a digital counting rate meter. In this case, one of the counting channels receives the pulses from a radioactivity sensor and the other a reference clock frequency. On associating said counting rate meter with one of the display means described in the aforementioned patent application, or with a dividing circuit included between the two registers, it is possible to directly obtain the activity in the chosen unit, namely Becquerels or e.g. a maximum admissable concentration (MAC).

The above explanation has been limited to a circuit only having two registers A and B. However, it is obvious that such an arrangement according to the invention can have numerous registers A,B,C,D . . . x, comparing the frequencies $F_A, F_B, F_C, F_D \ldots F_x$, the leading register being the register which is filled or saturated first and which brings about a shift to the right of the content of the said registers, including its own content. In such an arrangement, if the input frequencies are constant, the ratio of the content of a single register, used as the reference, with the content of each of the other registers remains constant.

The invention therefore relates to a digital comparator incorporating a first register provided with a so-called counting input for receiving and counting the pulses of a first pulse-type signal representing a fixed or evolutionary quantity and a so-called shift to the right input for carrying out a division of the number of counted pulses, characterized in that it comprises a second register identical to the first for receiving a second pulse-type signal representing a second fixed or evolutionary quantity and a device for bringing about a quasi-simultaneous shift to the right of the content of all the registers as soon as at least one of the registers is saturated or filled.

In an improvement, the register has several registers identical to the first and counting the pulses corresponding to a third, fourth, etc. fixed or evolutionary quantity.

In another improvement, the comparator has means for displaying the division of the number of pulses counted in one register with respect to that of pulses counted in another register, which transforms it into a ratiometer. The comparator presentation means can then be those referred to in the aforementioned patent application. Their principle is that the "1" of the rank furthest to the left (or highest significance), on counting from the right to the left, represents by default the base 2 logarithm of the content of the register. These representations means can also be the link with a data processing system or can be a device, which, after division of the content of the register or registers by the content of the register chosen as the reference register, presents the results on an appropriate display means, e.g. a cathode ray tube.

In another improvement of the invention account is taken of the fact that the shift to the right of the content of the registors loads to a statistical jump in the binary mode, on every other occassion, of the least significant value contained in said register which amounts to removing on average the value of ½ from the content of the register during each shift to the right. In order to obviate this disadvantage and re-establish the correctness of the measurement, in the ratiometer according to the invention, just prior to the shift to the right, all the registers to be shifted are incremented by one unit. This addition of a unit quantity followed by a division by two (resulting from the shift to the right) is then equivalent to a systematic addition of a quantity ½. The deduction and successive addition of said value ½ then cancel one another out, so that the measured signal has its correct value.

The invention will be better understood from reading the following description with respect to a multichannel amplitude analyser and in connection with the non-limitative embodiments described hereinafter relative to the drawings, wherein show:

FIGS. 1 to 3 energy and time diagrams of signals analysed in an analyser according to the invention in the radioactivity field.

FIG. 4 a functional diagram of a digital ratiometer according to the invention.

FIG. 5 an amplitude analyser equipped with digital ratiometers according to the invention.

FIG. 1 shows a time diagram and FIGS. 2 and 3 energy diagrams of a signal to be analysed by an amplitude analyser according to the invention. A radioactive event, e.g. constituted by the emission of a α-photon is detected by a scintillator which, by excitation, remits other photons detectable by a photomultiplier tube. The time electric signal available at the output of the photomultiplier tube has a pulse-type curve 1 like that shown in FIG. 1. It culminates in amplitude at a value 2 corresponding to an energy range 3 representing the energy of the initial photon. An amplitude analyser has an analog - digital pulse coder which, as indicated in FIG. 2, subdivides the radioactive events as a function of their energy. It also has a plurality of counters, each counter being allocated to an energy band with a given value. For example in FIG. 2, band 3 shows the number N of radioactive events belong to the energy band corresponding to the peak of the signal. In the conventional manner, the number N can be coded on 16 to 32 bits, whilst the energies can be coded on 8 to 14 bits. Thus, it is possible to have 256 channels with 16 K channels (K=1024) or different energy ranges, whilst the counting capacity of the number of events in a given range can spread over 16 to 32 bits.

FIG. 3 shows the evolution of the envelope of the signal available at the output of a conventional amplitude analyser as a function of time. Thus, over a measuring period, e.g. a few hours, the spectrum of an emission develops progressively and homothetically up to a maximum 4. The latter is the state of the analyser when a resetting of the counters of all the channels makes it possible to recommence the measurement. Thus, such an analyser comprises numerous event counters giving the envelope curve 4 as the usable output signals. In this way it is possible to recognize the displayed spectrum in order to load to the determination of the nature of the emission. In the invention, although this is not obligatory, the aforementioned signals are signals corresponding to said radioactive emission detection types.

FIG. 4 shows the functional diagram of a ratiometer according to the invention. This ratiometer comprises a first register 6 having an input 7 with counting by shift to the left 8 for receiving a first pulse-type signal 9 and for counting the pulses received. Register 6 has also an input 10 for shifting to the right 11, in order to carry out a division of the number of counted pulses. Thus, the admission of the pulses of signal 9 at input 7 for a given time means that the end of this period the cells, such as 12, of register 6 contain a content representing the number of counted pulses. The shift to the right by means of a shift to the right input 10 makes it possible to carry out a division of content of register 6 depending on the one hand on the counting mode in the register (generally a binary mode) and on the other hand the number of shift to the right cells (generally one cell : which is equivalent to a division by two).

One of the important characteristics of the invention is that the means for obtaining the result R comprise a second register 13 identical to register 6. Register 13 has an input 17 for receiving a second pulse-type signal (e.g. representing the time t in the case where the ratio-meter fulfills a counting rate meter function) and for counting by progression to the left 8, said T time pulses. It also has another input 19 for shift to the right 20 for carrying out a division of the counted pulses representing the second evolutionary quantity, in this case time. As the signals 9 and t evolve in time, a divider 14 e.g. receives by the respective buses 21, 22 and coming from registers 6 and 13, the contents N and T of said registers representing the counted pulses. Divider 14, which can be of the digital or analog type, then forms the ratio of these two numbers. In the measurement, where the detected activity, or signal 9, is substantially constant, the result R produced by divider 14 is constant. This constancy occurs no matter what the time at which there is simultaneously a shift to the right of the two registers 6 and 13, provided that said shift to the right takes place at the latest as soon as one of these two registers is filled.

Thus, the arrangement according to FIG. 4 makes it possible to overcome the fluctuation appearing in the ratiometer described in French Patent Application 8510173. In the arrangement of FIG. 4, the shift to the right of said two registers is brought about by means of an OR-gate 15. The latter receives as information the switchover of the most significant bit of each of the registers 6 and 13. The first of these registers which is filled then transmits its switchover signal to the OR-gate 15 and at the same time the latter supplies to the shift to the right inputs 10 and 19 of each of these two registers respectively the instructions 11 and 20 to shift to the right. These instructions have the effect of dividing by two, in the case of a binary register, the content of each of these two registers. It is pointed out that this procedure eliminating completely the effects of dynamic differences of the activities of the emissions to be analysed in no way modifies the result available at the output of divider 14. Thus, before and after the simultaneous shift to the right, the ratio of the numbers N and T is unchanged, because after said shift each of these numbers as been divided by two.

It has been explained hereinbefore that the division by two, in the binary mode, has the effect of statistically and systematically losing a value $\frac{1}{2}$ at each of the numbers N and T. In an improvement and with a view to compensating this statistical loss, the shift to the right of register 6 and 13 is only carried out after a unit of least significant value has been added to each of the registers 6 and 13. For example, a compensation circuit 16 receiving the information that one of the two registers 6 or 13 is full from the OR-gate 15 emits on one of its outputs 23 a pulse transmitted by the OR-gates, respectively 24 and 25, to the counting inputs, respectively 7 and 17 of registers 6 and 13. The OR-gates 24,25 make it possible to take account on these inputs 7 and 17 of one of the signals 9 and t on the one hand or a compensation pulse on the other. Once this compensation pulse has been introduced into registers 6 and 13, the shift to the right pulse is applied thereto. It is necessary for this shift to the right pulse to take place subsequently to the application of the compensation pulse. Nevertheless, consideration can be given to the carrying out of a shift to the right before supplying the compensation pulse. In this case a compensation pulse only has to be supplied for one shift to the right out of two.

Register 6 is e.g. suitable or counting events occurring in the energy band 3 (FIG. 2) and the previous description relates to a counting rate meter operating in such an energy band. Obviously an amplitude analyser involves many more channels. It has been stated that the energy levels could be coded on 8 to 14 bits, which mans that the analyser can have 256 to 16K channels, i.e. 256 to 16K registers, like register 6. All these registers, e.g. register 26, have a shift to the left counting input 27, a shift to the right input 28, a register state transmission bus 29 and a highest significance cell connected to the OR-gate 15 for indicating whether the register is the first to be filled. As hereinbefore, a logic OR-gate 31 makes it possible to take account either of the signal 32 of the channel to be measured, or the compensation pulse of the shift to the right. The diagram of FIG. 4 is only an operational diagram. Obviously, in practise, gate 15, compensation circuit 16 and OR-gates 24,25 and 31 can be replaced by logic instructions performing the same functions. FIG. 5 shows a more realistic architecture of an amplitude analyser having ratiometers operating as counting rate meters according to the invention. The signals to be detected appear at the input of the energy band discriminator 33, which supplies a signal and encodes an address corresponding to the measurement of the energy band in which the pulse corresponding to the radioactive event has culminated. An address register 34 receives the encoded address. It is related with a write register 34 which increments the value by one unit in a memory 36 and at the considered address. To this end, the write register 35 has a precabled or preprogrammed +1 instruction. At the address of the memory cell imposed by the address register 34 consequently appears the count of all the radioactive events which have corresponded to said energy band.

Thus, the registers considered up to now are reduced to their simplest expression and are constituted by memory cells with 16 to 32 bits as a function of the particular case. In general, weak energy bands are unusable in spectral analyses. In other words the memory 36 has memory cells, whose addresses correspond to these low energy bands and which are not used. It is then possible to use one of these memory cells for constituting the register 13 representing the measurement time. The incrementation of this time counter can be carried out directly, through the write register 34, on the basis of a clock 37, because its address is always the same.

By means of a read register 38, it is possible to sample the contents of all the memory cells of the memory, as well as the content of the time counter, so that in a divider 14 it is possible to form he ratio of the activities in each energy band relative to time.

In practise, the read register 38 coincides with the write register 35, which becomes a read and write register. FIG. 5 merely makes it possible to separate the functions.

Register 35–38 is provided with a detection of the filling of the registers contained in memory 36. If the filling of a random register is detected, a +1 instruction followed by a shift to the right of all the registers takes place. The detection of the filling of any register corresponds to the function of the OR-gate 15. The +1 instruction followed by the shift to the right corresponding to the statistical compensation and to the division by two, as explained hereinbefore.

The amplitude analyser according to the invention also has three further improvements. In a first improvement account is taken of the so-called active time. Thus, the discrimination by detector 33 of the energy range in which the pulse 1 has culminated is not instantaneous. It lasts a certain time during which clock 35 continues to emit pulses. However, during said coding time, the detector is unable to take account of a following pulse. Even though the duration of a pulse is short and the duration of said quantification is short relative to weak activity, it becomes very disturbing when the activity is high. To avoid this disadvantage clock 37 is neutralized during coding. Its operation is validated by a connection 39, which receives a signal from coder 33 and which throughout the coding time invalidates the operation of said clock 37. Therefore the time taken into account in the time counter 40 is only the active time.

It can also be useful in certain circumstances to measure the activity of a particularly inactive emission, whereas a very active emission is present. For example, in FIG. 2, it is possible to measure the weak activity in an energy band 41, whereas it is known that a high activity is present in band 3. If precautions are not taken said activity 3 can be so high that its allocated register rapidly becomes filled, which will lead to a shift to the right and the division of two of all the registers, including the register corresponding to the weak activity band 41. Consequently this weak activity will not be accurately known. To avoid this disadvantage, in parallel with the main memory 36 is provided an auxiliary memory 42, into which have been previously loaded addresses on zones of interest, i.e. addresses corresponding to the registers authorized to bring about a shift to the right in the case of filling. The unauthorized registers remain filled if their counting levels exceed the counting level of the authorized resisters. This auxiliary memory validates the operation of the read register 38. Thus, this register only brings about a shift to the right and compensation if the filling relates to a zone of interest.

In monitoring applications, the amplitude analyser can be placed out of the control of an operator. It can be connected to transmission and in particular radio transmission means 46 for transmitting the results of its measurements to the central control system 47.

In slave operation, system 47 in turn interrogates all the amplitude analysers dependent thereon. However, preferably, the amplitude analysers according to the invention have a comparator 48 of threshold S for permanently measuring the state of each of the channels of the analyser and for placing automatically placing in the emission mode intended for system 47 as soon as one of their channels, particularly those located in the zones of interest, has exceeded said measurement threshold. Operation in the slave mode would not make it possible to determine the time at which an abnormal phenomenon had occurred.

However, in the master mode, this knowledge in real time of the appearance of an abnormal phenomenon can be immediately displayed. This results from the fact that the registers corresponding to the different channels are no longer simple counting scales and are instead counting rate meters. The analyser operates under the control of a sequencer 49, which receives the instructions from the central system 47, or the detection of the exceeding of threshold S. Sequencer 49, coupled to the address register 34, organizes the reading and transmission of the content of the memory registers of memory 36. In a particular application, the apparatus is provided with a display device 43 receiving the addresses of the energy bands on the one hand and the resulting device 14 on the other. This display device can then present the results of the measurement in a form comparable to that referred to in connection with FIG. 2 (but without the fluctuations).

The invention is not limited to the case of the ratiometer described hereinbefore, particularly in its application to a counting rate meter, or to the case of the subsequently described amplitude analyser.

As stated hereinbefore, it covers arrangements making it possible to compare two quantities converted into two frequencies, random pulse trains, e.g. in the nuclear field, and/or periodic, e.g. clock pulse trains.

The fullest register at each instant is that which receives the largest signal (highest frequency). The equality of the quantities or frequencies is indicated by the equality of contents of the registers, which leads to the amplitude or frequency discriminator function. Accompanied by a display e.g. by light emitting diodes, of the content of the registers, such a device can provide an indication or alarm and followed by a feedback control it can make a quantity dependent on a reference.

I claim:

1. A digital comparator including a first register having a counting input adapted to receive and to count the pulses of a first pulse-type signal representing a fixed or evolutionary quantity and a shift to the right input for carrying out a division of the number (N( of counted pulses, comprising a second register, identical to the first, for receiving a second pulse-type signal representing a second fixed or evolutionary quantity, means for detecting the filling of one of the two registers, said means for detecting being connected to said two registers and means for at the same time carrying out the shift to the right of said two registers at the moment that said registers are filled, said means for carrying out being connected to said means for detecting.

2. A ratiometer incorporating the application of a comparator according to the apparatus as claimed in claim 1, comprising means for forming a ratio of the content of the first register by the content of the second register.

3. A ratiometer according to claim 2, wherein the means for carrying out the shifts to the right includes means associated with means for adding one unit to the registers before carrying out said shift to the right.

4. A comparator according to claim 1, further comprising a series of measuring channels, each channel having a register identical to the first register for counting a number of events in said channel.

5. A ratiometer according to claim 1, further comprising a series of measuring channels, each channel having a register identical to the fist register counting a number of events in said channel.

6. A multichannel amplitude analyser having a multichannel discriminator, comprising a ratiometer according to claim 5, wherein the second register receives a time-dependent signal and the other registers form the channels of the analyser and the discriminator discriminates an amplitude band of a signal in order to transfer each channel into a counting ratio meter.

7. An analyser according to claim 6, further comprising means for automatically transmitting these measurements when they exceed a certain threshold.

8. An analyser according to claim 6, further comprising means for neutralizing the effects of an excessive activity in one of the amplitude bands.

9. A numerical ratiometer comprising a first register having a counting input for receiving and counting the pulses of a first pulse signal representing a first quantity and a shift to the right input for carrying out a division of the number of counted pulses, a second register having a counting input for receiving and counting the pulses of a second pulse signal representing a second quantity and a shift to the right input for carrying out a division of the number of counted pulses, at least one of said first and second quantities evolving, means for taking into account the time at which one or other of the two registers becomes saturated, means for carrying out simultaneously the shift to the right of these two registers at the instant of said saturation and means for forming the ratio of the content of the first register by the content of the second register.

10. A ratiometer according to claim 9, wherein the means for carrying out the shifts to the right includes means for adding one unit to the first and second registers before carrying out their shift to the right.

11. An analyser according to claim 7, further comprising means for neutralizing the effects of an excessive activity in one of the amplitude bands.

* * * * *